United States Patent
Starkovich et al.

(10) Patent No.: US 9,482,477 B2
(45) Date of Patent: Nov. 1, 2016

(54) NANO-THERMAL AGENTS FOR ENHANCED INTERFACIAL THERMAL CONDUCTANCE

(71) Applicant: Northrop Grumman Systems Corporation, Falls Church, VA (US)

(72) Inventors: John A. Starkovich, Redondo Beach, CA (US); Jesse B. Tice, Torrance, CA (US); Edward M. Silverman, Encino, CA (US); Hsiao H. Peng, Rancho Palos Verdes, CA (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 4 days.

(21) Appl. No.: 14/444,095

(22) Filed: Jul. 28, 2014

(65) Prior Publication Data

US 2016/0025431 A1   Jan. 28, 2016

(51) Int. Cl.
  *H01L 23/42* (2006.01)
  *F28F 21/08* (2006.01)
  *C09K 5/14* (2006.01)
  *H01L 23/373* (2006.01)
  *F28F 13/00* (2006.01)

(52) U.S. Cl.
  CPC ............ *F28F 21/085* (2013.01); *C09K 5/14* (2013.01); *H01L 23/373* (2013.01); *H01L 23/3737* (2013.01); *H01L 23/42* (2013.01); *F28F 2013/006* (2013.01); *F28F 2255/20* (2013.01)

(58) Field of Classification Search
  CPC ....... F28F 21/085; H05K 3/10; H05K 3/102; Y10S 977/742; Y10S 977/762; Y10S 977/778; B82Y 30/00; C08J 5/04; C08J 5/041
  USPC ........................................................ 165/185
  See application file for complete search history.

(56) References Cited

U.S. PATENT DOCUMENTS

| 6,340,822 B1* | 1/2002 | Brown .............. H01L 23/49811 257/25 |
| 8,609,975 B2 | 12/2013 | Veerasamy |
| 2005/0046017 A1* | 3/2005 | Dangelo ................ B82Y 10/00 257/720 |
| 2007/0095652 A1* | 5/2007 | Knowles ................ B82Y 10/00 204/192.1 |
| 2007/0126116 A1* | 6/2007 | Dangelo ................ B82Y 10/00 257/720 |

(Continued)

FOREIGN PATENT DOCUMENTS

| CN | 102530828 | 7/2012 |
| EP | 1956110 | 8/2008 |

(Continued)

OTHER PUBLICATIONS

Ju Xu et al., Journal of Applied Physics, 2009, p. 106; website http://dx.doi.org/10.1063/1.3271149.*

(Continued)

*Primary Examiner* — Tho V Duong
(74) *Attorney, Agent, or Firm* — Patti & Malvone Law Group, LLC

(57) ABSTRACT

A thermal interface material (TIM) using high thermal conductivity nano-particles, particularly ones with large aspect ratios, for enhancing thermal transport across boundary or interfacial layers that exist at bulk material interfaces is disclosed. The nanoparticles do not need to be used in a fluid carrier or as filler material within a bonding adhesive to enhance thermal transport, but simply in a dry solid state. The nanoparticles may be equiaxed or acicular in shape with large aspect ratios like nanorods and nanowires.

12 Claims, 2 Drawing Sheets

(56) References Cited

U.S. PATENT DOCUMENTS

| | | | | |
|---|---|---|---|---|
| 2008/0143906 | A1* | 6/2008 | Allemand | B82Y 10/00 349/43 |
| 2009/0269604 | A1* | 10/2009 | Wang | H01L 23/373 428/545 |
| 2010/0172101 | A1 | 7/2010 | Yao et al. | |
| 2010/0196659 | A1 | 8/2010 | Razeeb et al. | |
| 2011/0318504 | A1* | 12/2011 | Han | C04B 35/62876 427/565 |
| 2012/0034422 | A1* | 2/2012 | Fairbank | B82Y 30/00 428/138 |
| 2012/0280168 | A1* | 11/2012 | Ma | C09K 5/14 252/75 |
| 2012/0321961 | A1 | 12/2012 | Yushin et al. | |
| 2012/0328469 | A1* | 12/2012 | Zhang | B22F 1/0025 420/501 |
| 2013/0295288 | A1 | 11/2013 | Fisher | |
| 2013/0299217 | A1* | 11/2013 | Yuen | H05K 1/097 174/257 |
| 2014/0227477 | A1* | 8/2014 | Cola | H01L 23/373 428/98 |

FOREIGN PATENT DOCUMENTS

| | | |
|---|---|---|
| EP | 2587564 | 5/2013 |
| JP | 2002038033 | 2/2002 |
| JP | 2008294376 | 12/2008 |
| JP | 2013098245 | 5/2013 |
| WO | 2005119771 | 12/2005 |
| WO | 2012147288 | 11/2012 |
| WO | 2013044094 | 3/2013 |
| WO | 2014015284 | 1/2014 |

OTHER PUBLICATIONS

Xu, J. et al; Silver nanowire array-polymer composite as thermal interface material; Journal of Applied Physics; vol. 106, No. 12; pp. 124310-1 thru 124310-7; Dec. 2009.

Feng, B. et al; Double-sided tin nanowire arrays for advanced thermal interface materials; Applied Physics Letters; vol. 102, No. 9; pp. 093105-1 thru 093105-4; Mar. 2013.

Sun, S. et al; Dissipating heat from hot spot using a new nano thermal interface material; Electronic Packaging Technology and High Density Packaging (ICEPT-HDP), 2012 13th International Conference on, pp. 171-176; Aug. 13-16, 2012.

Seshadri, I. et al; Interfacial thermal conductance-rheology nexus in metal-contacted nanocomposites; Applied Physics Letters, vol. 103, No. 17; pp. 173113-1 thru 173113-4; Oct. 2013.

Lu, D. et al; Enhancement of thermal conductivity of die attach adhesives (DAAs) using nanomaterials for high brightness light-emitting diode (HBLED); Electronic Components and Technology Conference (ECTC), 2011 IEEE 61st; pp. 667-672; May 31, 2011-Jun. 3, 2011.

Razeeb, K. et al; Nanowire-Polymer Nanocomposites as Thermal Interface Material; Advances in Nanocomposites-Synthesis; Characterization and Industrial Applications, InTech, Winchester (2011); pp. 685-706; intech.open.com.

Jiu, J. et al; Silver nanowires transparent conductive films: Fabrication using different sintering techniques; Nanotechnology (IEEE-NANO), 2013 13th IEEE Conference on, pp. 15-18; Aug. 5-8, 2013.

* cited by examiner

NANO-THERMAL AGENTS FOR ENHANCED INTERFACIAL THERMAL CONDUCTANCE

GOVERNMENT CONTRACT

The Government of the United States of America has rights in this invention pursuant to Government Contract No. 13-C-0048.

FIELD OF THE INVENTION

The invention relates generally to thermal interface materials (TIMs) for use in electronic devices.

BACKGROUND

Power levels and densities are greatly increasing for the next generation of high performance integrated circuit (IC) electronic devices, such as solid state lasers, power amplifiers, flip chip designs, and phase array antenna elements. As densities increase, device sizes are reduced and thermal management bottlenecks and heat dissipation challenges become a limiting factor in performance gains. High levels of heat generated by hundreds of millions of transistors within a few square centimeters can cause reliability issues if the heat is not dissipated effectively. These reliability issues include, for example, fractures, delamination, melting, corrosion and even combustion.

There is a demanding need for substantially more efficient thermal control systems to meet these challenges. Initially, heat sinks in direct contact with high heat generating IC components were used to dissipate heat. However, even nominally flat surfaces of heat sinks and ICs still appear rough at a microscopic level. This means that there are air gaps between the surfaces that have a high thermal resistance. Thermal interface materials such as greases and conductive particle-filled epoxies have been developed to address this problem. More recently, carbon nanotube arrays (CNTs) have been developed as a more efficient TIM.

R&D efforts have largely been focused on improving bulk thermal conductivity of TIMs employed in fabricating the devices as well as the thermal conductor links and heat sinks used in the thermal management system between devices. While significant improvements in material bulk conductivity have been made and theoretical analyses predict conductivities greater than 20× copper are possible with certain nanomaterials, much less effort and success has been realized in reducing thermal interfacial or contact resistance, which is now becoming the limiting factor to performance gains.

Thermal interfacial resistance is the serial combination of the bulk conductivity of the material between two surfaces and the contact resistances at each material interface. The thermal interfacial resistance governs thermal conductance and the overall thermal control efficiency. Due to microscopic asperities between mating surfaces contact areas are reduced, increasing thermal contact resistance. Reduction in contact resistances can lead to lower device operating temperatures, improved performance, and reliability. Additions of high conductivity nanoparticles to the gaps/void areas in boundary regions increase their heat exchange area and can significantly reduce thermal contact resistance.

Materials previously used for reducing thermal contact resistances have included: filled greases, solders and polymer composite materials. Thermal grease formulations do not meet advanced thermal conductance requirements and are subject to wicking and leakage of fluid carrier. Solder and polymer adhesive based interface agents are subject to debonding due to large thermal stresses caused by mismatch in adherend thermal expansion properties. CNTs have been proposed as substances with high thermal conductivity and low thermal impedance, however; they require expensive manufacturing facilities and high synthesis temperatures that can damage electronic components. Also, the presence of impurities, the existence of voids and the growth conditions of CNTs result in large uncertainties in their performance as TIMs. CNTs that are manufactured separately then inserted between the electronic device and its heat sink have the disadvantage of somewhat higher thermal interface resistance since the individual CNT are not directly attached to the growth surface.

Thus, a need exists for an improved thermal interface material with reduced thermal contact resistance that can be readily manufactured and can be reliably inserted in heat flow path and used to cool high power density electronic devices.

SUMMARY

In a first aspect, the invention involves the use of high thermal conductivity nano-particles, particularly ones with large aspect ratios, for enhancing thermal transport across boundary or interfacial layers that exist at bulk material interfaces. The nanoparticles do not need to be used in a fluid carrier or as filler material within a bonding adhesive to enhance thermal transport, but simply in a dry solid state. The nanoparticles may be equiaxed or acicular in shape with large aspect ratios like nanorods and nanowires.

In an embodiment, the invention is a thermal interface material (TIM) having a base material for providing heat transfer between two surfaces in an electronic device and a plurality of high thermal conductivity nanoparticles distributed on the surface of the base material.

In a further embodiment, the TIM base material is a vertically aligned carbon nanotube array. In another embodiment, the nanoparticles are nanorods or nanowires. In yet another embodiment, the aspect ratios of the nanorods or nanowires may be between approximately 5 and over 1,000.

In further embodiments, the nanoparticles are silver nanowires having an aspect ratio of approximately 1000; copper nanowires or nanorods; gold nanowires or nanorods; nanodiamonds; nanotubes made of boron nitride; or acicular nanorods or nanowires.

In another embodiment, a thermal interface material for use in an integrated circuit (IC) electronic device is disclosed, the TIM including a vertically aligned carbon nanotube array (VACNT) for providing heat transfer between two surfaces in the electronic device and a plurality of high thermal conductivity nanoparticles distributed on the surface of the VACNT, said nanoparticles having aspect ratios between approximately 5 and over 1,000.

DESCRIPTION OF THE DRAWINGS

Features of example implementations of the invention will become apparent from the description, the claims, and the accompanying drawings in which:

DETAILED DESCRIPTION

Figure 1A:
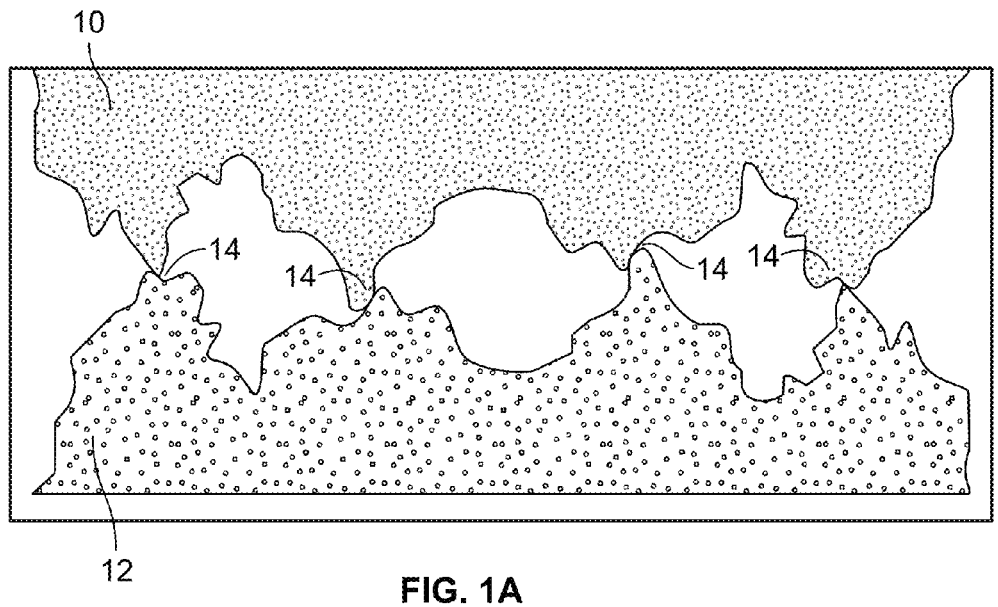
FIG. 1A depicts an interface between two surfaces in an IC electronic device.

The real areal contact area available for heat exchange between prior art surfaces at a microscopic level is illustrated in FIG. 1A. Although surfaces 10 and 12 may appear flat to the naked eye, real contact areas 14 are very much less than the apparent contact area leading to restricted heat flow and high thermal resistance.

Figure 1B:
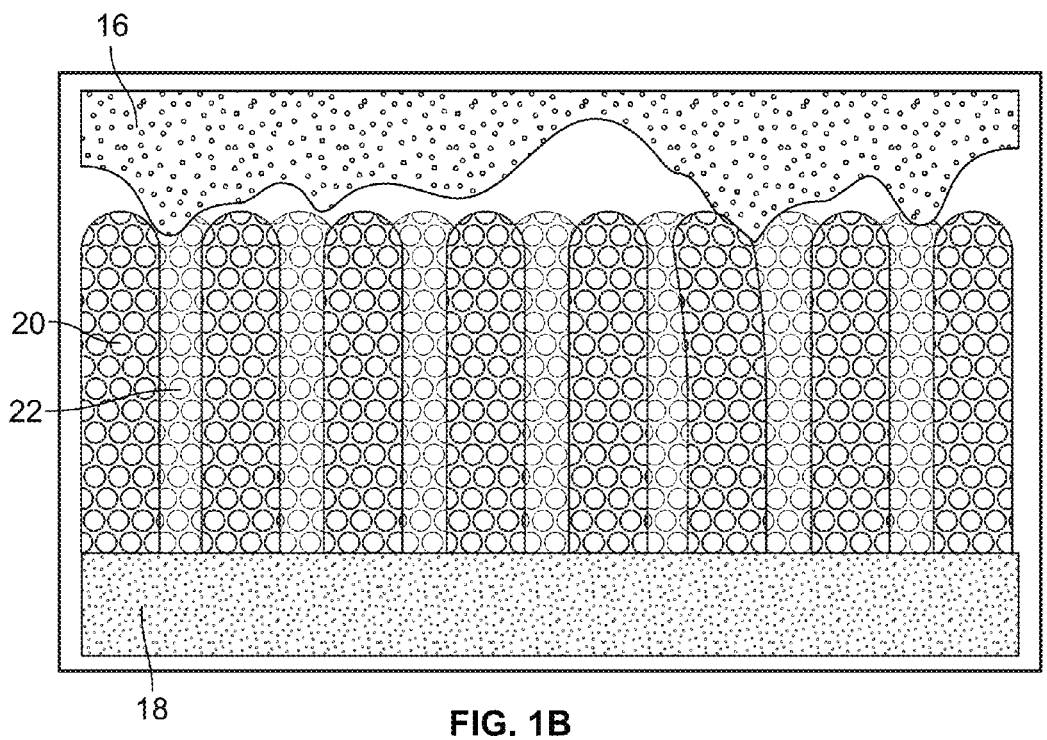
FIG. 1B depicts a prior art VACNT thermal interface.

FIG. 1B depicts surfaces 16 and 18 with a prior art thermal interface material (TIM) to provide improved heat flow. The TIM is a vertically aligned carbon nanotube array (VACNT). The nanometer-scale thermal transport agents are able to promote expanded physical/thermal contact between mating surfaces beyond their bridging asperities but have several disadvantages as explained above, such as expensive manufacturing facilities, high synthesis temperatures that can damage electronic components and the presence of impurities.

The invention concept entails a thermal interface material where high thermal conductivity, nanometer-dimension agents have been deposited in the junction or boundary regions between mating part surfaces in order to reduce their thermal contact resistance. Due to their nanometer-dimension size these agents can fit within and fill millimeter-to-nanometer size voids that exist with all practical material surfaces regardless of their state, type surface finish or roughness.

High thermal conductivity nanoparticles, particularly ones with large aspect ratios, are used for enhancing thermal transport across boundary or interfacial layers that exist at bulk material interfaces. The aspect ratio of a nanoparticle is defined as the ratio of the particle's largest linear dimension to its smallest dimension. Nanoparticles can have aspect ratios as low as approximately 5:1 up to 10,000:1 and higher. In other forms, nanoparticles can be equiaxed such as, nanodiamonds, for example. Many terms are commonly used to describe nanoparticles of various shapes and dimensions, including nanorod, nanotube, nanofilament, nanowire and nanodiamond.

Figure 2:
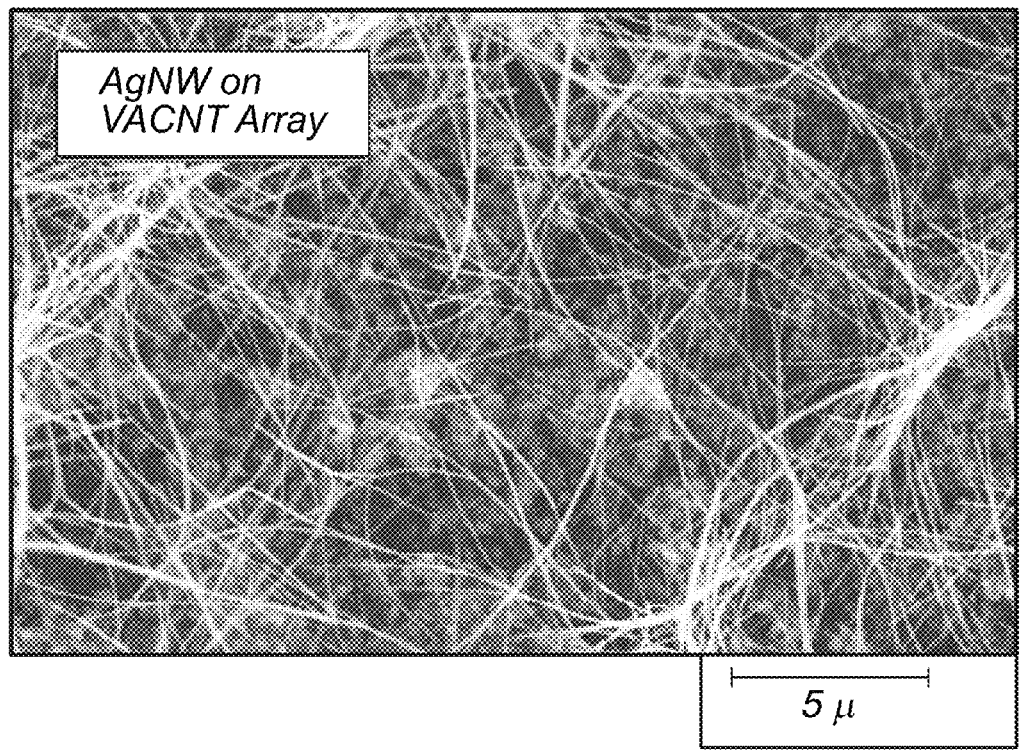
FIG. 2 depicts a thermal interface material (TIM) of the present invention.

According to an embodiment, the nanoparticles do not need to be used in a fluid carrier or as filler material within a bonding adhesive to enhance thermal transport, but simply in a dry solid state distributed in the boundary region. The nanoparticle agents may be used with bulk materials having micrometer or larger asperities or roughness figures as well as with low density nano-based thermal interface materials such as VACNT arrays to substantially reduce thermal contact resistance. Used in conjunction with high conductivity VACNT arrays, they offer a compliant interface with stable thermal transport properties. FIG. 2 depicts a preferred embodiment of the invention where silver nanowires (AgNW) have been deposited on a VACNT. The 1000:1 aspect ratio of AgNW shown in FIG. 2 illustrates the space spanning and co-planar character of these interface agents.

In alternative embodiments, the nanoparticles may be equiaxed or acicular in shape with more moderate aspect ratios. The high thermal conductive particles may be electrically insulating like nanodiamonds, nano-boron nitride particles or electrically conductive and consist of silver, copper or gold nanowires/rods (NW, NR). Particularly effective are acicular NW with aspect ratios of 5 to 10,000. They lie flat in the interface region easily spanning large gaps/troughs and accommodating mating surfaces with high roughness figures.

Figure 3:
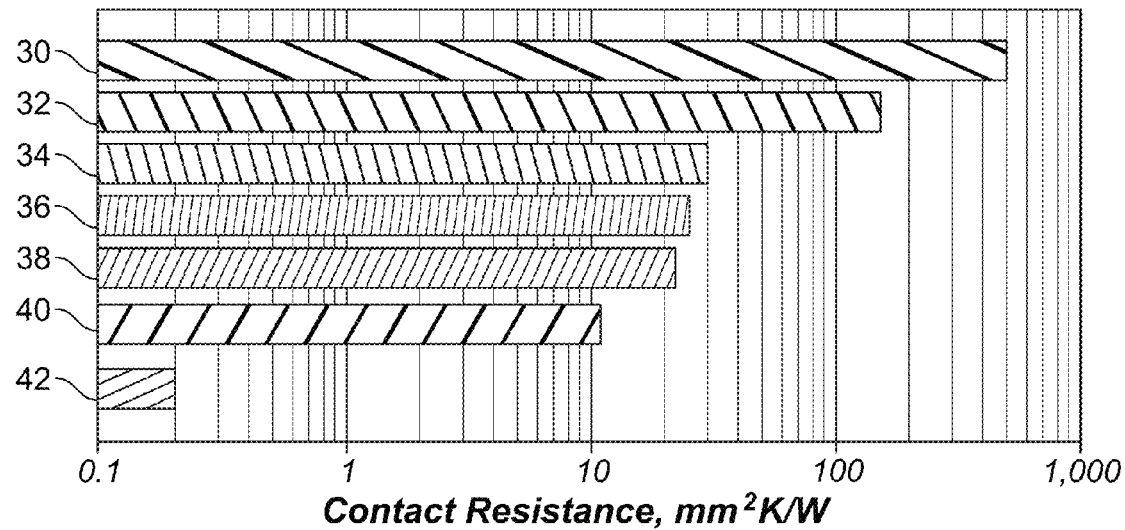
FIG. 3 depicts a chart comparing the contact resistance of several TIMs.

The performance and scale of reduction in contact resistance achievable with NW interface agents are shown in FIG. 3. Several alternative thermal interface agents and their contact resistance in units of $(m^2K)/W$ are identified and compared. These include viscous thermal greases, for example Arctic Silver 5® shown at 30 and Shin-Etsu MicroSi G751® shown at 32, and filled epoxy adhesives such as Ablebond 965 shown at 34 or Diemat SK70 shown at 36. FIG. 3 also shows the achievable contact resistance of polyurethane (PU) VACNT arrays (Si substrate) at 38 and PU VACNT (Quartz substrate) at 40.

Finally, 42 of FIG. 3 depicts a TIM according to a preferred embodiment of the invention, a PU VACNT with AgNW. As shown, this TIM reduces contact resistance by a factor of 100×. AgNW interface agents are also seen to meet and beat DARPA's ambitious Nanotechnology Interface (NTI) program's 1 $mm^2K/W$ goal.

The steps or operations described herein are just for example. There may be many variations to these steps or operations without departing from the spirit of the invention. For instance, the steps may be performed in a differing order, or steps may be added, deleted, or modified.

Although example implementations of the invention have been depicted and described in detail herein, it will be apparent to those skilled in the relevant art that various modifications, additions, substitutions, and the like can be made without departing from the spirit of the invention and these are therefore considered to be within the scope of the invention as defined in the following claims.

What is claimed is:

1. A thermal interface material (TIM) comprising:
   a vertically aligned carbon nanotube array (VACNT) for providing heat transfer between two surfaces in an electronic device; and
   a plurality of high thermal conductivity nanorods or nanowires distributed on the surface of the VACNT such that they are co-planar and lie flat in an interface region between the VACNT and one of the surfaces in the electronic device.

2. The TIM of claim 1 wherein the nanorods or nanowires have aspect ratios between approximately 5 and over 1,000.

3. The TIM of claim 2 wherein the nanorods or nanowires further comprise silver nanowires having an aspect ratio of approximately 1000.

4. The TIM of claim 2 wherein the nanorods or nanowires further comprise copper nanowires or nanorods.

5. The TIM of claim 2 wherein the nanorods or nanowires further comprise gold nanowires or nanorods.

6. The TIM of claim 2 wherein the nanorods or nanowires further comprise nanotubes made of boron nitride.

7. The TIM of claim 1 wherein the nanorods or nanowires further comprise acicular nanorods or nanowires.

8. A thermal interface material (TIM) for use in an integrated circuit (IC) electronic device, comprising:
   a vertically aligned carbon nanotube array (VACNT) for providing heat transfer between two surfaces in the electronic device; and
   a plurality of high thermal conductivity nanoparticles distributed on the surface of the VACNT such that they are co-planar and lie flat in an interface region between the VACNT and one of the surfaces in the electronic device, said nanoparticles having aspect ratios between approximately 5 and over 1,000.

9. The TIM of claim 8 wherein the nanoparticles further comprise silver nanowires having an aspect ratio of approximately 1000.

10. The TIM of claim 2 wherein the nanoparticles further comprise copper nanowires or nanorods.

11. The TIM of claim 2 wherein the nanoparticles further comprise gold nanowires or nanorods.

12. The TIM of claim 2 wherein the nanoparticles further comprise nanotubes made of boron nitride.

* * * * *